United States Patent [19]
Kuo et al.

[11] Patent Number: 6,033,955
[45] Date of Patent: Mar. 7, 2000

[54] METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE

[75] Inventors: Tiao-Hua Kuo, San Jose; Yasushi Kasa, Cupertino; Nancy Leong, Sunnyvale; Johnny Chen, Cupertino; Michael Van Buskirk, Saratoga, all of Calif.

[73] Assignees: Advanced Micro Devices, Inc., Sunnyvale, Calif.; Fujitsu Limited, Kanagawa-Ken, Japan

[21] Appl. No.: 09/159,023

[22] Filed: Sep. 23, 1998

[51] Int. Cl.⁷ .................................................. H01L 21/8247
[52] U.S. Cl. ............................................. 438/257; 438/598
[58] Field of Search ..................................... 438/597, 598, 438/618, 586, 264, 257; 257/315, 321; 365/185.03, 185.05

[56] References Cited

U.S. PATENT DOCUMENTS

| | | | |
|---|---|---|---|
| 5,245,572 | 9/1993 | Kosonocky et al. | 365/189.02 |
| 5,554,867 | 9/1996 | Ajika et al. | 257/314 |
| 5,618,742 | 4/1997 | Shone et al. | 438/263 |
| 5,631,179 | 5/1997 | Sung et al. | 438/264 |
| 5,631,864 | 5/1997 | Briner | 365/185.05 |
| 5,659,500 | 8/1997 | Mehrad | 365/185.05 |
| 5,723,350 | 3/1998 | Fontana et al. | 437/43 |
| 5,777,359 | 7/1998 | Ra | 257/314 |
| 5,814,857 | 9/1998 | Park | 257/321 |
| 5,841,696 | 11/1998 | Chen et al. | 365/185.11 |
| 5,847,998 | 12/1998 | Van Buskirk | 365/185.33 |
| 5,851,879 | 12/1998 | Lin et al. | 438/257 |
| 5,867,430 | 2/1999 | Chen et al. | 365/189.04 |
| 5,956,268 | 9/1999 | Lee | 365/185.03 |
| 5,960,283 | 9/1999 | Sato | 438/257 |
| 5,966,601 | 10/1999 | Ling et al. | 438/257 |
| 5,973,356 | 10/1999 | Nobel et al. | 257/310 |

*Primary Examiner*—Tom Thomas
*Assistant Examiner*—Lex H. Malsawma
*Attorney, Agent, or Firm*—Fliesler, Dubb, Meyer & Lovejoy

[57] ABSTRACT

A method of forming flexibly partitioned metal line segments 10 and 12 for separate memory banks in a simultaneous operation flash memory device with a flexible bank partition architecture comprises the steps of providing a basic metal layer 2 comprising a plurality of basic metal layer segments 2a, 2b, 2c, ... 2j separated by a plurality of gaps 6a, 6b, 6c, ... 6i, each of the gaps having a predefined gap interval length, and providing a metal option layer 8 comprising a plurality of metal option layer segments on the basic metal layer 2, the metal option layer segments overlapping the gaps between the basic metal layer segments but leaving one of the gaps open, to form the metal line segments for the separate memory banks.

39 Claims, 6 Drawing Sheets

METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE

TECHNICAL FIELD

The present invention relates to a flash memory device, and more particularly, to a method of making flexibly partitioned metal line segments in a simultaneous operation flash memory device with a flexible bank partition architecture.

BACKGROUND ART

Non-volatile memory devices have been developed by the semiconductor integrated circuit industry for various applications such as computers and digital communications. A conventional flash memory device typically includes a single fixed memory bank. A conventional simultaneous operation flash memory device typically has two fixed memory banks each comprising a fixed number of sectors of memory cells. Each sector of memory cells has a fixed amount of memory storage, for example, 0.5 megabytes (MB) and consists of a fixed number of pages of memory cells, for example, sixteen pages of memory cells. A page is typically defined as one word of memory stored in the memory cells on a single word line.

In a conventional simultaneous operation flash memory device, such as a conventional simultaneous operation NOR flash memory array, the memory cells are divided into an upper memory bank and a lower memory bank. The upper and lower memory banks each have a predetermined fixed size of memory storage. The upper and lower memory banks are typically used for different functions. For example, the upper memory bank may be used for code storage, whereas the lower memory bank may be used for data storage. Because the upper and lower bank memory partitions are fixed in conventional simultaneous operation flash memory devices, different flash memory devices with different integrated circuit designs are required for different memory partitions. Therefore, in order to customize the memory circuit for a variety of applications which require different partitions of the upper and lower memory banks for code and data storage, a different circuit design would be required for each of the fixed upper and lower memory bank partitions in a conventional simultaneous operation flash memory device.

Because the size of memory storage in each of the upper and lower banks is not variable in a conventional simultaneous operation non-volatile memory device, a single circuit design may be suitable for only one of several different applications in which different partitions of the upper and lower memory banks are required. In order to produce simultaneous operation flash memory devices with different partitions of the upper and lower memory banks, a different circuit design and a different set of associated masks are required for each of the devices.

A disadvantage of having to design a different integrated circuit and a full set of different masks for each of the simultaneous operation flash memory devices with different upper and lower bank memory partitions is that the design, fabrication and testing processes can be very costly and time-consuming. Therefore, there is a need for a simultaneous operation flash memory device with a flexible bank partition architecture. Furthermore, there is a need for a method of making flexibly partitioned metal line segments for the bit lines in the flash memory array as well as associated decoding circuits for flexibly dividing the flash memory into upper and lower memory banks while obviating the need for designing completely different sets of masks for the metal lines in the flash memory device.

DISCLOSURE OF THE INVENTION

The present invention satisfies these needs. In accordance with the present invention, a method of forming flexibly partitioned metal line segments for a simultaneous operation flash memory device with a flexible bank partition architecture generally comprises the steps of:

(a) providing a plurality of basic metal layer segments separated by a plurality of gaps, each of the gaps having a predefined gap interval length; and (b) providing a metal option layer comprising a plurality of metal option layer segments on the basic metal layer segments, each of the metal option layer segments having a length at least as much as the gap interval length of a respective one of the gaps between the basic metal layer segments, the metal option layer segments overlapping some of the gaps between the basic metal layer segments but leaving one of the gaps open, to form a conductive path between the gaps except the one of the gaps which is left open, the basic metal layer segments and the metal option layer segments together forming first and second metal line segments for the simultaneous operation flash memory device with the flexible bank partition architecture.

In an embodiment, the step of providing the basic metal layer segments comprises the step of designing a mask pattern for the basic metal layer on a computer by using a computer-aided design (CAD) technique, and the step of providing the metal option layer comprises the step of designing a mask pattern for the metal option layer segments by using the CAD technique on the computer. The number of metal option layer segments is one less than the number of gaps between the basic metal layer segments. The mask for the metal option layer segments is designed such that when the two mask patterns are combined on the computer, the mask pattern for the metal option layer segments overlaps the mask pattern for the basic metal layer segments except that it leaves one of the gaps in the basic metal layer open. The open gap forms the memory partition boundary between the upper memory bank and the lower memory bank.

In a further embodiment, the mask pattern for the basic metal layer is a fixed pattern with a fixed number of gaps at predetermined positions on the basic metal layer, each of the gaps designating a respective one of a plurality of predetermined memory partition boundaries. After one of the predetermined memory partition boundaries has been selected, the data for the selected memory partition boundary can be entered into the computer which selects the mask pattern for the metal option layer segments. After the mask patterns for the basic metal layer and for the metal option layer segments are combined on the computer, a single mask pattern is formed with two metal line segments, one for the upper memory bank and the other for the lower memory bank.

In an alternate embodiment, the step of providing the basic metal layer segments comprises the steps of depositing a basic metal layer on a semiconductor substrate and etching the basic metal layer to form the basic metal layer segments. In a further embodiment, the step of providing the basic metal layer segments further comprises the steps of patterning a first mask with a pattern of the basic metal layer segments separated by the gaps and positioning the first mask on the basic metal layer prior to the step of etching the basic metal layer.

In an additional embodiment, the step of providing the metal option layer on the basic metal layer segments comprises the step of depositing the metal option layer segments on the respective gaps between the basic metal layer segments. In a further embodiment, the step of providing the metal option layer on the basic metal layer segments further comprises the step of providing a mask on the basic metal layer segments exposing the gaps which are to be overlapped with the metal option layer segments prior to the step of depositing the metal option layer segments on the respective gaps.

In order to separate the flash memory array into an upper memory bank and a lower memory bank, the total number of metal option layer segments is one less than the total number of gaps between the basic metal layer segments. The basic metal layer segments are each capable of supporting at least one sector in the memory device. The gap in the basic metal layer left open by the metal option layer segments subsequent to the step of providing the metal option layer on the basic metal layer separates the basic metal layer into first and second basic metal layer segments. The first and second basic metal layer segments are capable of supporting the upper and lower memory banks of the flash memory device, respectively. Furthermore, the length of each of the metal option layer segments may be greater than the gap interval length of the respective gap between the basic metal layer segments to form a conductive path between the basic metal layer segments, except for the gap which is left open by the metal option layer segments to separate the flash memory array into the upper memory bank and the lower memory bank.

The method of forming metal line segments for upper and lower memory banks in a simultaneous operation flash memory device with a flexible bank partition architecture is applicable to the fabrication of bit lines in the memory array on an M2 metal layer and the fabrication of metal line segments for a variety of decoding circuits, such as X-decoders and pre-decoders for the simultaneous operation flash memory device. In a simultaneous operation flash memory device with the flexible bank partition architecture, each of the bit lines in the memory array is separated into first and second M2 line segments connected to the memory cells in the lower and upper memory banks, respectively. Similarly, the decoding circuits for the simultaneous operation flash memory device with a flexible bank partition architecture may also include metal option lines each having first and second metal line segments fabricated according to the method of the present invention.

Advantageously, the present invention provides a method of forming flexibly partitioned metal line segments for a simultaneous operation flash memory device with a flexible bank partition architecture. A further advantage of the present invention is that it allows flexible partitioning of the flash memory device into upper and lower memory banks with a memory partition boundary selected from one of several predetermined partition boundaries by changing the mask pattern of only the metal option layer. Yet a further advantage of the present invention is that it obviates the need for designing different masks for fabricating the integrated circuit structure other than the mask for forming the metal option layer segments on top of the basic metal layer.

BRIEF DESCRIPTION OF THE DRAWINGS

The present invention will be described with respect to particular embodiments thereof, and references will be made to the drawings in which.

MODES FOR CARRYING OUT THE INVENTION

Figure 1:
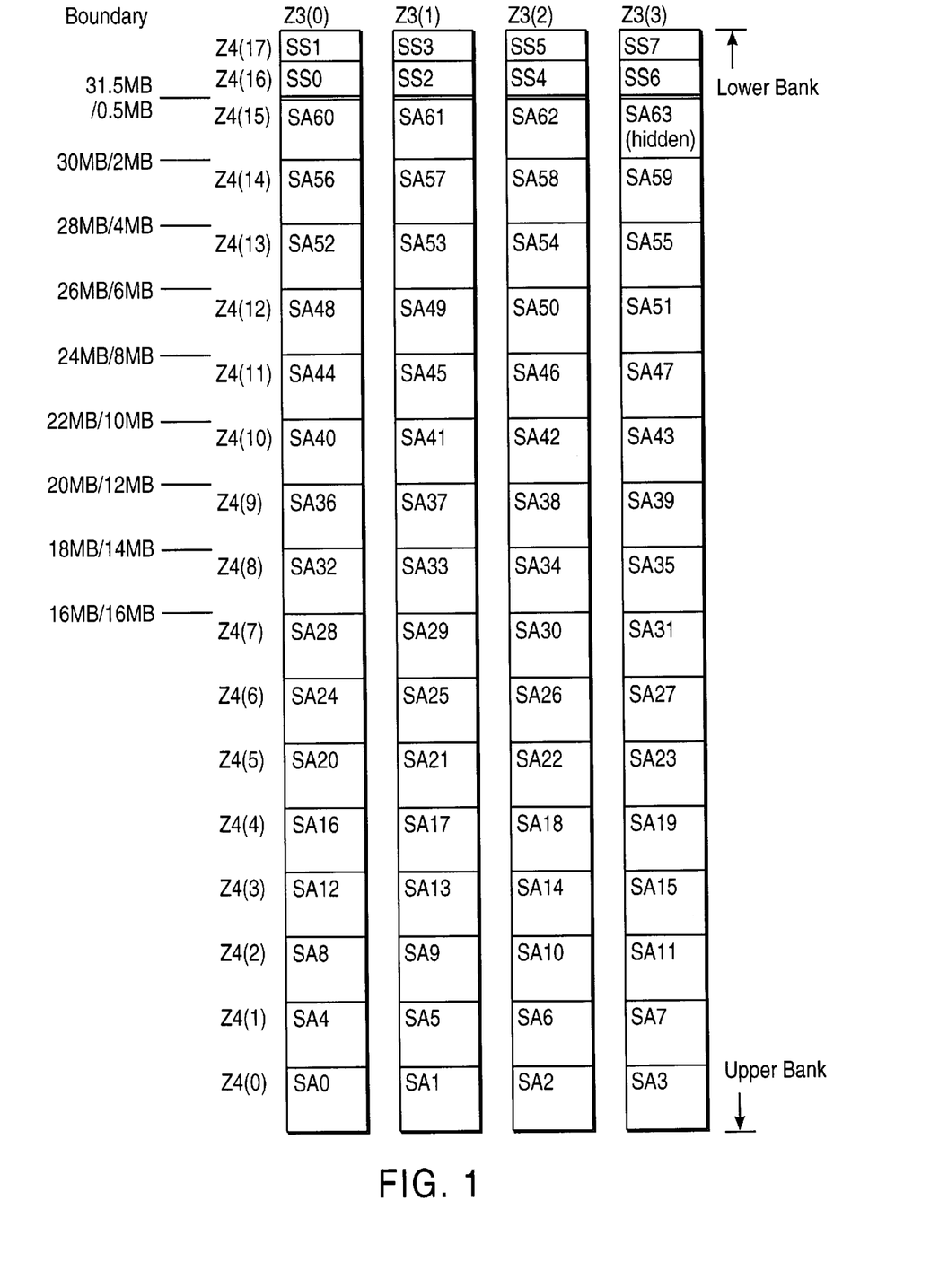
FIG. 1 is a diagram showing an embodiment of a simultaneous operation flash memory device comprising a plurality of blocks of memory cells with a plurality of flexibly partitioned boundary lines capable of partitioning the memory into an upper memory bank and a lower memory bank.

FIG. 1 shows a simplified diagram of a simultaneous operation non-volatile memory device, for example, a NOR flash memory device which includes a plurality of sectors of memory cells indicated by blocks SA0, SA1, SA2, . . . SA63. The memory sectors SA0, SA1, SA2, . . . SA63 are arranged in a plurality of rows and columns, with each row containing four memory sectors. The rows of the memory sectors are numbered consecutively from Z4(0) to Z4(15). Furthermore, the NOR flash memory device as shown in FIG. 1 includes memory sectors SS0, SS1, SS2, . . . SS7 arranged in rows Z4(16) to Z4(17).

Each sector of the memory cells SA0, SA1, SA2, . . . SA63 includes 0.5 megabytes (MB) of memory. Each row of the memory sectors Z4(0), Z4(1), Z4(2), . . . Z4(15) includes 2 MB of memory. The last memory sector SA63 is optional and may be regarded as a hidden memory sector. The total memory capacity of the memory sectors SS0, SS1, SS2, . . . SS7 is on the order of about 0.5 MB. The 0.5 MB of memory in the sectors SS0, SS1, SS2, . . . SS7 may be regarded as a predetermined minimum lower bank memory required for code storage. FIG. 1 also shows a plurality of memory partition boundary lines, each of which is capable of bisecting the memory into an upper memory bank and a lower memory bank. An example of some possible partitions of a 32 MB simultaneous operation flash memory device according to the present invention is illustrated in FIG. 1., with the number before the slash denoting the amount of memory in the upper memory bank and the number after the slash denoting the amount of memory in the lower memory bank. The memory partition boundary can be set between any adjacent rows of memory sectors, with each adjacent boundary change resulting in either an increment or a decrement of 2 MB in the upper and lower memory banks if each memory sector contains 0.5 MB of memory and each row contains 4 memory sectors.

FIG. 1 shows only an example of many different possible partitions of memory in a simultaneous operation flash memory device with a flexible bank partition architecture. However, the present invention is not limited to the memory partition boundaries as illustrated in FIG. 1; other memory partition boundaries are also feasible. For example, whereas FIG. 1 shows the memory partition boundaries which yield a minimum of 16 MB and a maximum of 31.5 MB of memory in the upper bank and a minimum of 0.5 MB and a maximum of 16 MB of memory in the lower bank, other memory partition boundaries can be set which give the upper bank less than 16 MB of memory and the lower bank more than 16 MB of memory. For example, flexible memory partition boundaries can also be set between the rows Z4(0) and Z4(1), between Z4(1) and Z4(2), and so on.

Figure 2:
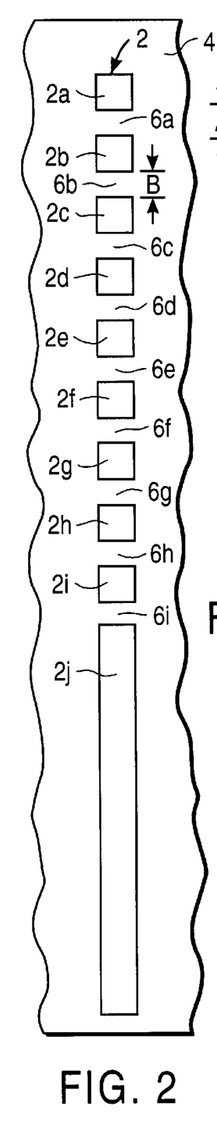
FIG. 2 shows a simplified plan view of a basic metal layer with a plurality of gaps separating the basic metal layer into a plurality of basic metal layer segments.

FIG. 2 is a simplified plan view of a basic metal layer 2 which is formed on a semiconductor substrate 4 according to the method of the present invention. The basic metal layer 2 comprises a plurality of basic metal layer segments 2a, 2b, 2c, . . . 2j in the form of basic metal layer strips. A plurality of gaps 6a, 6b, 6c, . . . 6i are positioned between the adjacent basic metal layer segments 2a and 2b, 2b and 2c, 2c and 2d, . . . 2i and 2j, respectively. The basic metal layer segments 2a, 2b, 2c, . . . 2j are formed by the basic metal layer strip 2 separated by the open gaps 6a, 6b, 6c, . . . 6i and serve as a basis for the basic metal layer fabricated according to the method of the present invention for a flash memory device with a flexible bank partition architecture.

In an embodiment, a mask pattern for the basic metal layer with basic metal layer segments 2a, 2b, 2c, . . . 2j is prepared on a computer by using a computer-aided design (CAD) technique. The computer-aided design of mask patterns can be achieved by using conventional CAD software for designing integrated circuit masks. Because the gaps 6a, 6b, 6c, . . . 6i between the basic metal layer segments each designate a respective one of a plurality of predetermined memory partition boundaries, the number of gaps and their positions on the basic metal layer 2 are fixed. Any one of these memory partition boundaries can be selected as the memory partition boundary for the simultaneous operation flash memory device by preparing a mask pattern for a metal option layer which is described below. Therefore, a fixed mask pattern for the basic metal layer as shown in FIG. 2 is able to serve as the basis for a variety of simultaneous operation flash memory devices with memory bank partition boundaries at the predefined gaps in the basic metal layer.

In an alternate embodiment, the basic metal layer segments 2a, 2b, 2c, . . . 2j are provided on the semiconductor substrate 4 by depositing a basic metal layer on the substrate 4 and etching the basic metal layer to form the basic metal layer segments 2a, 2b, 2c, . . . 2j. In a further embodiment, the basic metal layer segments 2a, 2b, 2c, . . . 2j are formed by patterning a first mask with a pattern of the basic metal layer segments 2a, 2b, 2c, . . . 2j separated by the respective gaps 6a, 6b, 6c, . . . 6i and positioning the first mask on the basic metal layer prior to the step of etching the basic metal layer. The depositing, patterning and etching of the basic metal layer to form the basic metal layer segments 2a, 2b, 2c, . . . 2j may be accomplished by conventional methods of metal processing on a semiconductor device known to a person skilled in the art.

Figure 3:
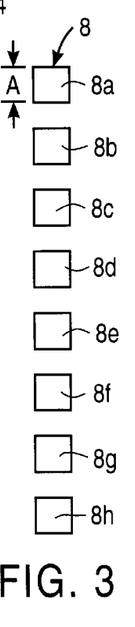
FIG. 3 shows a simplified plan view of a plurality of metal option layer segments before they are provided on the basic metal layer as shown in FIG. 2.

In accordance with the present invention, the method of fabricating flexibly partitioned metal line segments for a simultaneous operation flash memory device with a flexible bank partition architecture further comprises the step of providing a metal option layer 8 comprising a plurality of metal option layer segments 8a, 8b, 8c, . . . 8h as shown in FIG. 3 on top of the basic metal layer segments 2a, 2b, 2c, . . . 2j as shown in FIG. 2. The total number of metal option layer segments 8a, 8b, 8c, . . . 8h is one less than the total number of gaps 6a, 6b, 6c, . . . 6i between the basic metal layer segments 2a, 2b, 2c, . . . 2j. Each of the metal option layer segments 8a, 8b, 8c, . . . 8h as shown in FIG. 3 has a length A at least as much as the gap interval length B of the respective one of the gaps 6a, 6b, 6c, . . . 6i in FIG. 2. The metal option layer segments 8a, 8b, 8c, . . . 8h, which are to be placed on top of the respective gaps 6a, 6b, 6c, . . . 6h in the basic metal layer 2, may each have a length A slightly greater than the gap interval length B of the respective gap, such that a conductive path is formed between the basic metal layer segments 2a and 2i after the metal option layer 8 as shown in FIG. 3 is provided on top of the basic metal layer 2 as shown in FIG. 2.

Figure 4:
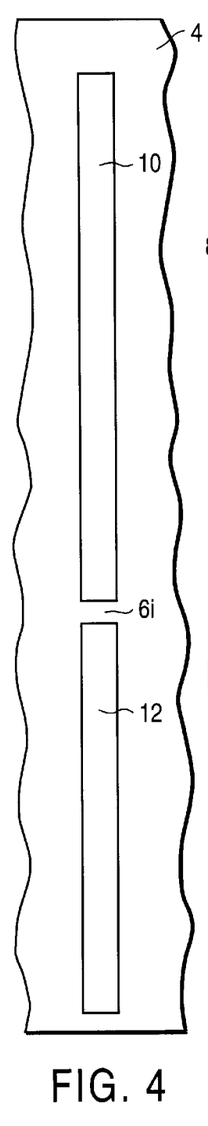
FIG. 4 shows a simplified plan view of a metal layer after the metal option layer segments as shown in FIG. 3 are provided on the basic metal layer as shown in FIG. 2 according to the method of the present invention.

After the metal option layer segments 8a, 8b, 8c, . . . 8h are placed on top of the basic metal layer 2, either physically or by overlapping the mask patterns for the basic metal layer and for the metal option layer on a computer, the metal option layer segments 8a, 8b, 8c, . . . 8h overlap the respective gaps 6a, 6b, 6c, . . . 6h in the basic metal layer 2 except for the gap 6i which is left open, such that the basic metal layer segments 2a, 2b, 2c, . . . 2i are connected by the metal option layer segments 8a, 8b, 8c, . . . 8h to form a single metal strip, whereas the basic metal layer segment 2j forms another metal strip. FIG. 4 shows a simplified plan view of the basic metal layer on the substrate 4 after the metal option layer 8 as shown in FIG. 3 is provided on top of the basic metal layer 2 as shown in FIG. 2.

In FIG. 4, a first metal line segment 10 is formed by electrically connecting the basic metal layer segments 2a, 2b, 2c, . . . 2i in FIG. 2 with the metal option layer segments 8a, 8b, 8c, . . . 8h in FIG. 3 and serves as the metal layer strip for the lower memory bank. A second metal line segment 12 in FIG. 4 is the same as the basic metal layer segment 2j in FIG. 2 and serves as the metal layer strip for the upper memory bank. The metal layer strip 10 for the lower memory bank and the metal layer strip 12 for the upper memory bank are separated by the gap 6i, which is left open after the metal option layer segments 8a, 8b, 8c, . . . 8h are provided on the basic metal layer 2 to connect the basic metal layer segments 2a, 2b, 2c, . . . 2i together. In the example shown in FIG. 4, the gap 6i between the basic metal layer strips 10 and 12 defines an upper bank/lower bank memory partition boundary of 16 MB/16 MB.

In an embodiment, a mask pattern for the metal option layer 8 with metal option layer segments 8a, 8b, 8c, . . . 8h is prepared on a computer by using a computer-aided design (CAD) technique. The design of the mask pattern for the metal option layer 8 can be achieved by using conventional CAD software for designing mask patterns for integrated circuits. After a memory partition boundary is selected from a plurality of predetermined partition boundaries, that is, after a particular gap designating the selected partition boundary is selected from the plurality of gaps 6a, 6b, 6c, . . . 6i in the basic metal layer 2 as shown in FIG. 2, the data for the metal option layer segments 8a, 8b, 8c, . . . 8h as shown in FIG. 3 are entered into the computer to produce a mask pattern for the metal option layer 8 as shown in FIG. 3.

The mask patterns for the metal option layer 8 as shown in FIG. 3 and for the basic metal layer as shown in FIG. 2 are then combined together by using a computer-aided design technique on the computer to produce a mask pattern for first and second metal line segments 10 and 12 separated by the gap 6i as shown in FIG. 4. The mask patterns are combined such that the metal option layer segments 8a, 8b, 8c, . . . 8h in FIG. 3 overlap the gaps 6a, 6b, 6c, . . . 6h in FIG. 2, respectively, to produce the mask pattern for the metal line strips 10 and 12 as shown in FIG. 4. The open gap 6i in FIG. 4 designates a memory partition boundary that separates the memory blocks as shown in FIG. 1. The memory partition boundary defined by the gap 6i partitions the flash memory into an upper bank and a lower bank each comprising 16 MB of memory.

In an alternate embodiment, the metal option layer segments 8a, 8b, 8c, . . . 8h as shown in FIG. 3 are deposited on the respective gaps 6a, 6b, 6c, . . . 6h between the basic metal layer segments 2a, 2b, 2c, . . . 2i as shown in FIG. 2. In a further embodiment, the step of providing the metal option layer 8 on the basic metal layer 2 further comprises the step of providing a mask on the basic metal layer 2 exposing the gaps 6a, 6b, 6c, . . . 6h which are to be overlapped with the metal option layer segments 8a, 8b, 8c, . . . 8h prior to the step of depositing the metal option layer segments prior to the step of depositing the metal option layer segments 8a, 8b, 8c, . . . 8h on the respective gaps 6a, 6b, 6c, . . . 6h. The gap 6i, which is to be left open to define the memory partition boundary, is not deposited with the metal option layer 8.

As shown in FIG. 4, the metal line segments 10 and 12 separated by the gap 6i are capable of supporting two separate memory banks. For example, the first metal line segment 10 may serve as a bit line segment of an M2 metal layer for the lower memory bank and the second metal line segment 12 may serve as another bit line segment of the M2 metal layer for the upper memory bank. The upper and lower memory banks may be used for different functions. For example, the upper memory bank may be used for data storage while the lower memory bank may be used for code storage.

When a flash memory device with a different upper bank/lower bank memory bank partition is required, only the pattern of the metal option layer 8 need be changed in order to form the metal line segments for the upper and lower memory banks with a gap left open at a different position to partition the memory into upper and lower banks with a different upper bank/lower bank memory ratio. The basic metal layer segments 2a, 2b, 2c, . . . 2j need not be changed in order to accommodate a different memory partition ratio.

Figure 5:
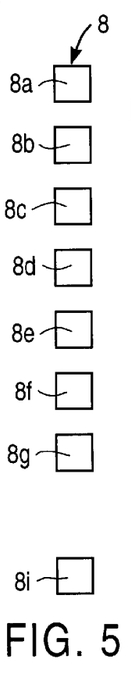
FIG. 5 shows a simplified plan view of another pattern of metal option layer segments before they are provided on the basic metal layer as shown in FIG. 2.

As another illustrative example, FIG. 5 shows another pattern of a metal option layer 8 which includes metal option layer segments 8a, 8b, 8c, . . . 8g and 8i. In contrast with the metal option layer segments as shown in FIG. 3, the metal option layer in FIG. 5 includes the metal option layer segment 8i instead of 8h. When the metal option layer segments 8a, 8b, 8c, . . . 8g and 8i as shown in FIG. 5 are positioned on top of the basic metal layer 2 in FIG. 2, the metal option layer segments 8a, 8b, 8c, . . . 8g and 8i overlap the gaps 6a, 6b, 6c, . . . 6g and 6i, respectively. The gap 6h is left open by the metal option layer 8. As in the previous example, the total number of metal option layer segments 8a, 8b, 8c, . . . 8g and 8i in the metal option layer 8 as shown in FIG. 5 is one less than the total number of gaps 6a, 6b, 6c, . . . 6i as shown in FIG. 2.

Figure 6:
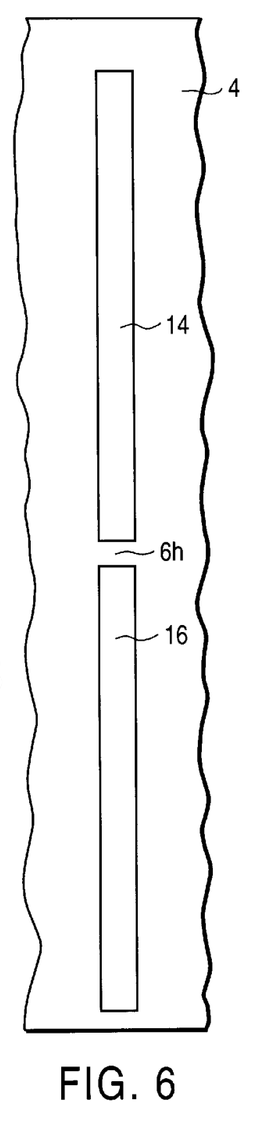
FIG. 6 shows a simplified plan view of a metal layer after the metal option layer segments as shown in FIG. 5 are provided on the basic metal layer as shown in FIG. 2 according to the method of the present invention.

After the metal option layer segments 8a, 8b, 8c, . . . 8g and 8i are deposited on the respective gaps 6a, 6b, 6c, . . . 6g and 6i in the basic metal layer 2 in FIG. 2, first and second basic metal layer strips 14 and 16 are formed on the semiconductor substrate 4 as shown in FIG. 6. A conductive path is formed between the basic metal layer segments 2a and 2h along the basic metal layer strip 14, and another conductive path is formed between the basic metal layer segments 2i and 2j along the basic metal layer strip 16. Alternatively, the mask patterns for the basic metal layer and for the metal option layer can be combined together on a computer to produce a single mask pattern for the metal line segments as shown in FIG. 6.

As shown in FIG. 6, the gap 6h separates the metal line segments 14 and 16 and forms a memory partition boundary between the upper and lower memory banks. The first basic metal layer segment 14 may support the lower bank for code storage while the second basic metal layer segment 16 may support the upper memory bank for data storage. In this case, the gap 6h serves as a memory partition boundary between the upper and lower memory banks with an upper bank/lower bank memory ratio of 18 MB/14 MB.

Figure 7A:
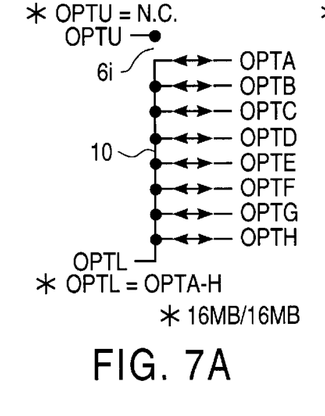
FIGS. 7A–7I illustrate examples of memory partition boundaries in a 32 MB flexibly partitioned flash memory device with nine possible partition boundaries.

Referring back to FIG. 2, the gaps 6a, 6b, 6c, 6d, 6e, 6f, 6g, 6h, and 6i in the basic metal layer 2 designate a plurality of predetermined possible memory partition boundaries in a 32 MB flash memory device with upper bank/lower bank memory ratios of 31.5 MB/0.5 MB, 30 MB/2 MB, 28 MB/4 MB, 26 MB/6 MB, 24 MB/8 MB, 22 MB /10 MB, 20 MB/12 MB, 18 MB/14 MB and 16 MB /16 MB, respectively. FIGS. 7A–7I illustrate the partitioning of the 32 MB flash memory device into upper and lower memory banks with upper bank/lower bank memory ratios of 16 MB /16 MB, 18 M/14 MB, 20 M/12 M, . . . 31.5 MB/0.5 MB , respectively. For example, FIG. 7A illustrates a memory partition with an upper bank/lower bank ratio of 16 MB /16 MB , which is achieved by the metal line segments 10 and 12 separated by the gap 6i as shown in FIG. 4 resulting from the overlapping of the metal option layer 8 shown in FIG. 3 with the respective gaps 6a, 6b, 6c, . . . 6h in the basic metal layer 2 shown in FIG. 2.

In FIG. 7A, the metal options OPTA, OPTB, OPTC, . . . OPTH are electrically connected to the metal line segment 10 for the lower memory bank to support 16 MB of lower bank memory on rows Z4(8), Z4(9), . . . Z4(17), which include memory sectors SA32, SA33, . . . SA63 and SS0, SS1, . . . SS7 as shown in FIG. 1. In FIG. 7A, the metal line segment 12 supports 16 MB of upper bank memory on rows Z4(0), Z4(1), . . . Z4(7), which include memory sectors SA0, SA1, . . . SA31 as shown in FIG. 1. In the embodiment described above, a minimum of 16 MB of memory is allocated to the upper memory bank for data storage.

Figure 7B:
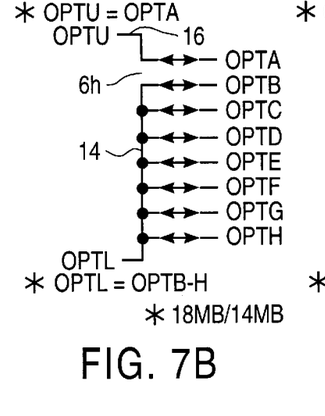

FIG. 7B shows a memory partition boundary with an allocation of 18 MB to the upper memory bank and 14 MB to the lower memory bank. The memory partitioning as shown in FIG. 7B corresponds to the metal layer pattern as shown in FIG. 6, with the gap 6h separating the metal line segment 16 for the upper memory bank from the metal line segment 14 for the lower memory bank. In FIG. 7B, the metal line segment 14 for the lower memory bank is electrically connected to the metal options OPTB, OPTC, . . . OPTH, which correspond to rows Z4(9), Z4(10), . . . Z4(17) as shown in FIG. 1. The metal option OPTA as shown in FIG. 7B corresponds to the row Z4(8) as shown in FIG. 1. In FIG. 7B, the metal line segment 16 for the upper memory bank is electrically connected to the metal option OPTA for the row Z4(8) as well as rows Z4(0) . . . Z4(7) as shown in FIG. 1. In this example, the upper memory bank contains 18 MB of memory while the lower memory bank contains 14 MB of memory.

The metal option layer segments can be patterned such that when they are formed on the basic metal layer 2 as shown in FIG. 2, a gap between the basic metal layer segments for the upper and lower memory banks may be left open at any one of the positions 6i, 6h, 6g, . . . 6a to produce a desired memory partition. FIGS. 7C–7I illustrate other examples of upper bank/lower bank memory partition boundaries with different upper bank/lower bank memory ratios. FIGS. 7C–7H illustrate memory partition boundaries with changes in the memory capacities of the upper memory bank in 2 MB increments and the lower memory bank in 2 MB decrements. FIG. 7I illustrates a memory partition boundary with a minimum of 0.5 MB allocated to the lower memory bank for code storage and an upper memory bank of 31.5 MB for data storage.

Figure 7C:
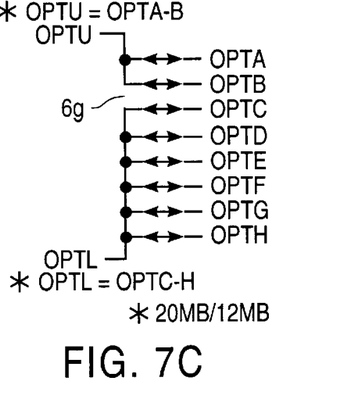
Figure 7D:
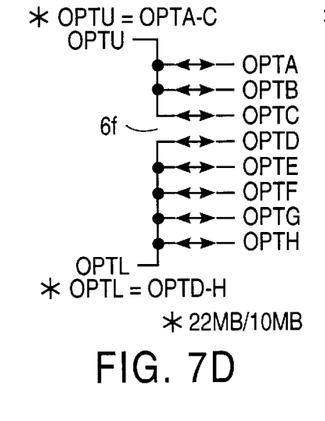
Figure 7E:
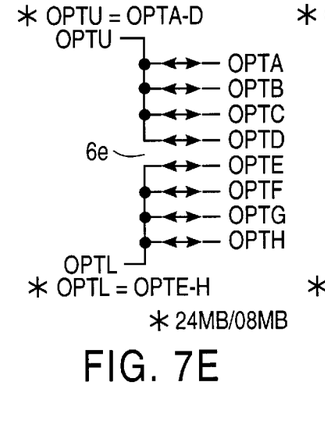
Figure 7F:
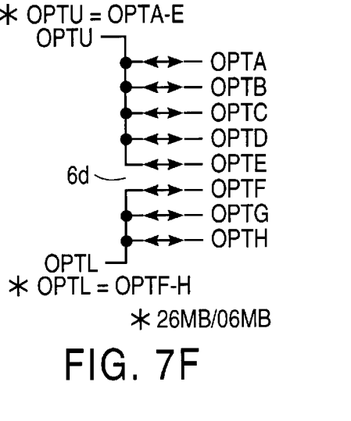
Figure 7G:
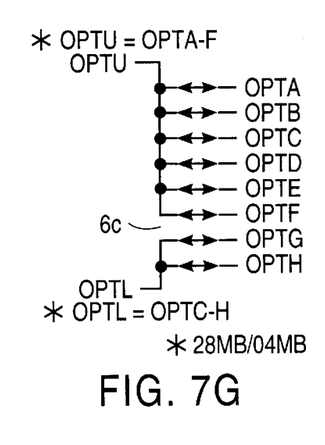
Figure 7H:
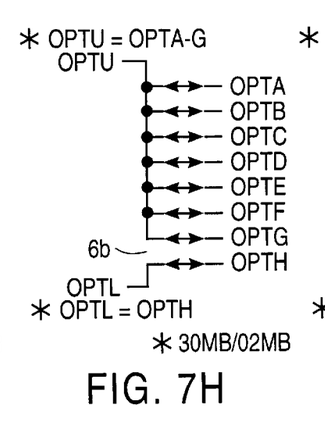
Figure 7I:
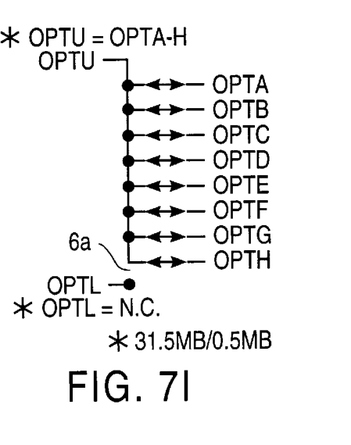

The memory partition boundaries 6g, 6f, . . . 6a in respective FIGS. 7C, 7D, . . . 7I correspond to the gaps with the same reference numerals in the basic metal layer 2 shown in FIG. 2. For example, when the gap 6a is left open after the metal option layer is provided on the basic metal layer 2 to form the metal line segments, the memory partition as shown in FIG. 7I is produced, with 31.5 MB of memory including those on the metal options OPTA, OPTB, . . . OPTH allocated to the upper memory bank and 0.5 MB of memory allocated to the lower memory bank. In another example, if the gap 6b in FIG. 2 is left open after the metal option layer is provided on the basic metal layer 2, basic metal layer segments are formed for the memory partition as shown in FIG. 7H, with 30 MB of memory including those on metal options OPTA, OPTB, . . . OPTG allocated to the upper memory bank and 2 MB of memory including those on metal option OPTH allocated to the lower memory bank.

Figure 8:
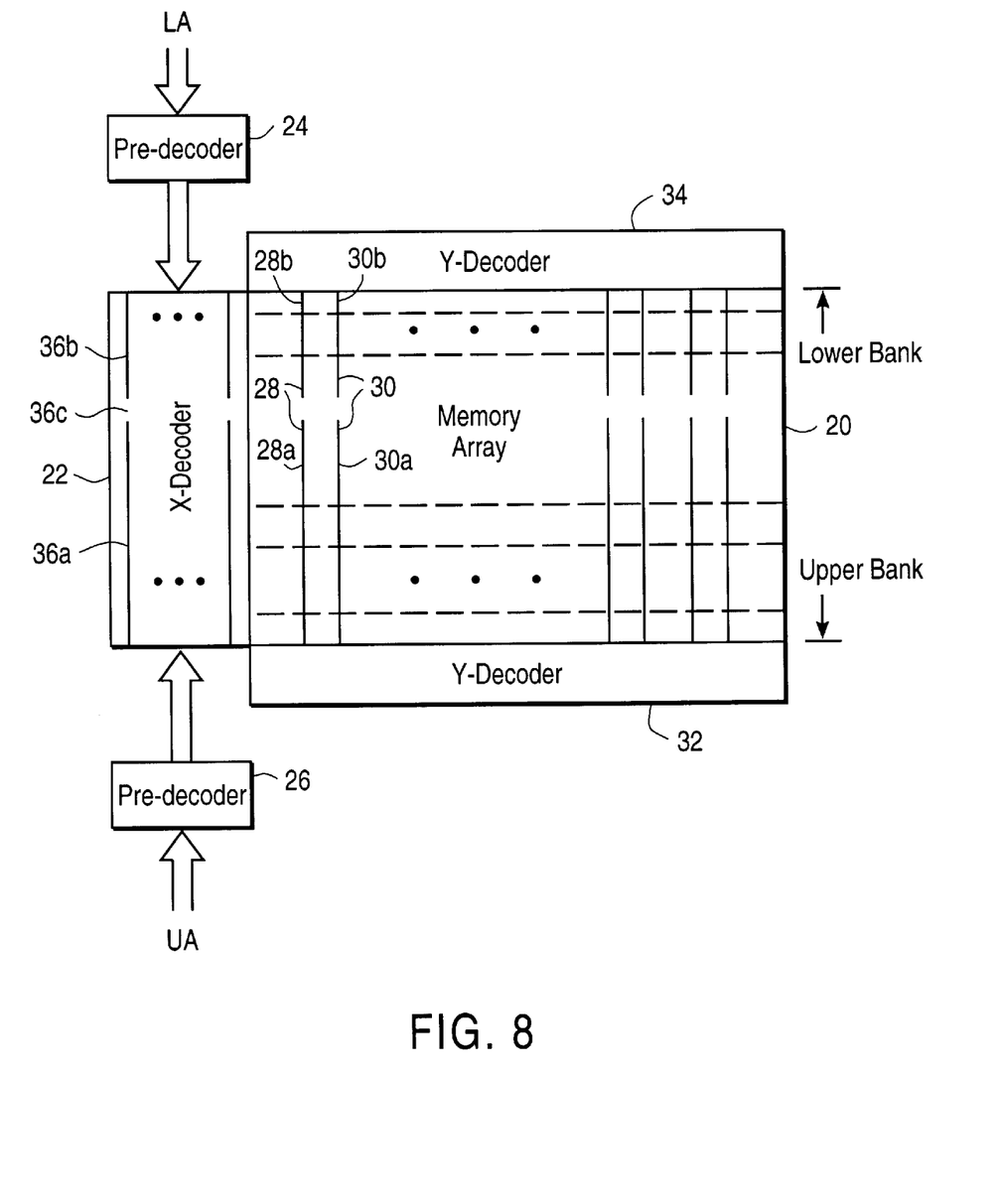
FIG. 8 illustrates an example of a simultaneous operation flash memory device with a flexible bank partition architecture including a memory array and an X-decoder each having a plurality of flexibly partitioned metal line segments fabricated according to the method of the present invention.

FIG. 8 illustrates an example of a simultaneous operation flash memory device with a flexible bank partition architecture to which the method of forming flexibly partitioned metal line segments according to the present invention is applicable. As shown in FIG. 8, the simultaneous operation flash memory device comprises a memory array 20, an X-decoder 22 coupled to the memory array 20, and two pre-decoders 24 and 26 coupled to the X-decoder 22. The pre-decoders 24 and 26 are coupled to receive lower and upper bank memory addresses denoted as LA and UA, respectively. The memory array 20, which comprises a plurality of memory cells arranged in a plurality of columns and rows, includes a plurality of bit lines such as bit lines 28 and 30 connected to the respective columns of memory cells.

The bit lines in the memory array each comprise a first metal line segment connected to the respective column of memory cells assigned to the upper memory bank and a second metal line segment connected to the respective column of memory cells assigned to the lower memory bank. For example, the bit lines 28 and 30 comprise first and second bit line segments 28a, 28b and 30a, 30b, respectively, as shown in FIG. 8. The bit lines 28 and 30 each have a respective gap between the respective first and second bit line segments to serve as a partition boundary between the lower and upper memory banks. The bit line segments for the upper memory bank are connected to a first Y-decoder 32, and the bit line segments for the lower memory bank are connected to a second Y-decoder 34. The bit lines in the memory array 20 are usually formed by using a metal layer called the M2 metal layer. The pattern of the bit lines in the memory array 20 each comprising first and second M2 metal line segments can be formed by using the method of forming the flexibly partitioned metal line segments in accordance with the present invention.

Furthermore, the X-decoder 22 as shown in FIG. 8 also comprises a plurality of metal line segments such as segments 36a and 36b separated by a gap defining the memory partition boundary. For example, the first metal line segment 36a may be implemented for decoding the respective rows of memory cells in the upper memory bank while the second metal line segment 36b in the X-decoder 22 may be implemented for decoding the respective rows of memory cells in the lower memory bank of the memory array 20. The method of forming flexibly partitioned metal line segments according to the present invention is also applicable to the fabrication of the metal line segments such as segments 36a and 36b in the X-decoder 22.

Figure 9:
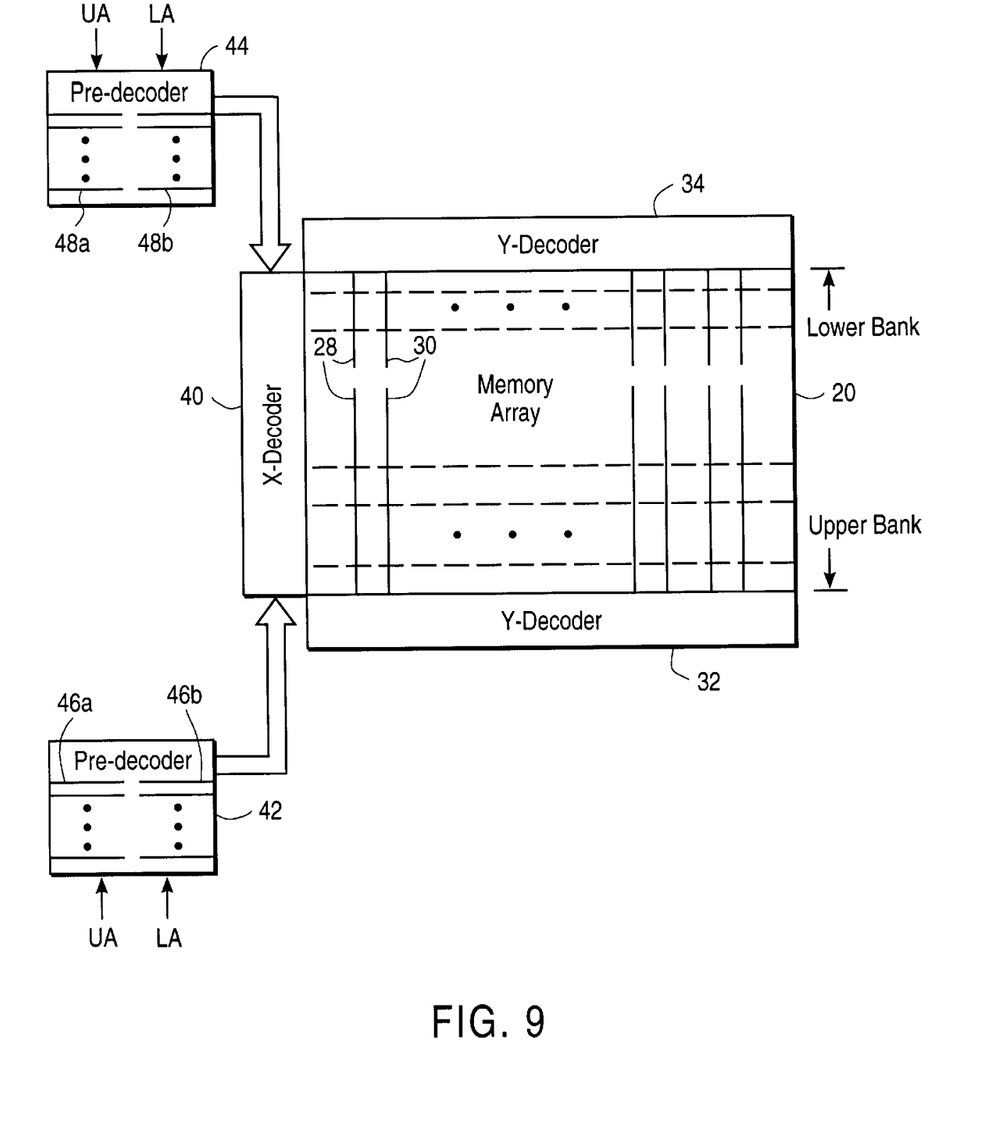
FIG. 9 illustrates another example of a simultaneous operation flash memory device with a flexible bank partition architecture including a memory array and two pre-decoders each having a plurality of flexibly partitioned metal line segments fabricated according to the method of the present invention.

FIG. 9 illustrates another example of a simultaneous operation flash memory device with a flexible bank partition architecture to which the method of forming flexibly partitioned metal line segments according to the present invention is applicable. In this example, the memory array 20 with flexibly partitioned bit line segments 28 and 30 and the Y-decoders 32 and 34 for the respective upper and lower memory banks are similar to those which are shown in FIG. 8 and described above. However, the X-decoder 40 is a fixed-bank row decoder for the memory array 20 in this example. The X-decoder 40 has two inputs connected to first and second pre-decoders 42 and 44, respectively.

Within each of the pre-decoders 42 and 44, a plurality of metal line segments are provided to receive upper and lower bank memory address inputs denoted as UA and LA, respectively. For example, in the first pre-decoder 42, first and second metal line segments 46a and 46b are coupled to pre-decode the upper and lower bank memory address inputs UA and LA, respectively. Similarly, first and second metal line segments 48a and 48b in the second pre-decoder 44 are coupled to pre-decode the upper and lower bank memory address inputs UA and LA, respectively. The method of forming flexibly partitioned metal line segments according to the present invention is applicable to the fabrication of the bit lines 28 and 30 in the memory array 20 as well as the fabrication of the metal line segments 46a, 46b, 48a and 48b in the pre-decoders 42 and 44.

Figure 10:
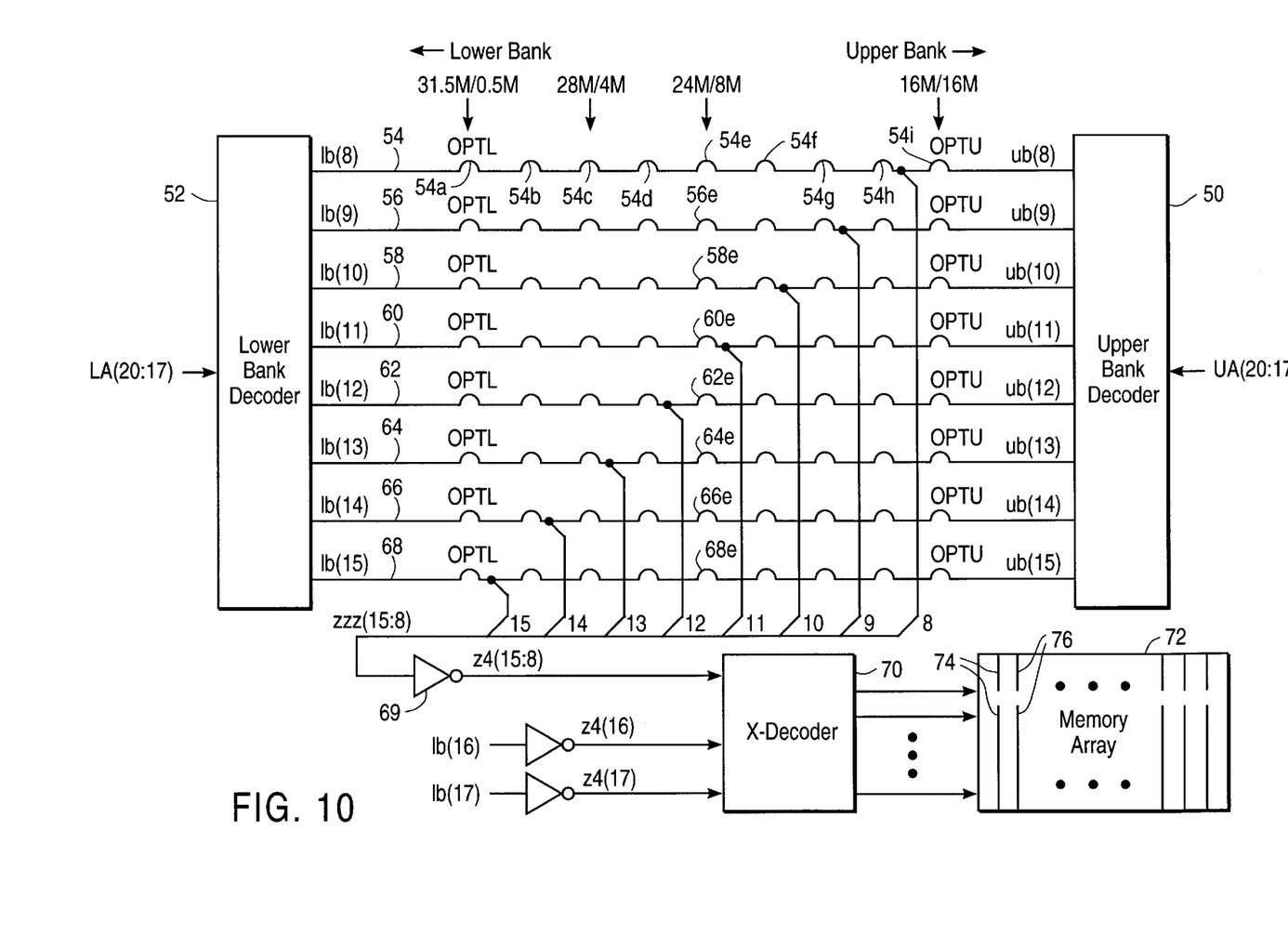
FIG. 10 illustrates an example of a decoding circuit with a plurality of flexibly partitioned metal line segments fabricated according to the method of the present invention.

FIG. 10 illustrates an example of a decoding circuit for a simultaneous operation flash memory device with a flexible bank partition architecture to which the method of forming flexibly partitioned metal line segments according to the present invention is applicable. The decoding circuit comprises an upper bank decoder 50 and a lower bank decoder 52 capable of receiving at least some address bits of upper and lower bank memory addresses denoted as UA and LA, respectively. A plurality of metal lines 54, 56, 58, 60, 62, 64, 66 and 68 are positioned between the upper and lower bank decoders 50 and 52. Each of the metal lines has a plurality of predetermined gaps each corresponding to a respective one of a plurality of predetermined possible memory partition boundaries. For example, the metal line 54 has nine possible memory partition boundaries 54a, 54b, 54c, . . . 54i. The other metal lines have the same number of possible partition boundaries. For example, when an upper bank/lower bank memory boundary of 24 MB/8 MB is desired, gaps 54e, 56e, 58e, . . . 68e are formed on the respective metal lines 54, 56, 58, . . . 68 to separate the metal lines into the respective metal line segments for the lower and upper memory banks.

The bank address decoding output ZZZ(15:8), which is an 8-bit output connected to receive the respective bank address decoding bits from the respective metal lines 54, 56, 58, . . . 68, receives some of the decoding bits from the lower bank decoder 52 and other decoding bits from the upper bank decoder 50, depending upon the locations of the gaps along the respective metal lines. For example, when the gaps are formed at the designated locations 54*e*, 56*e*, 58*e*, . . . 68*e* along the respective metal lines 54, 56, 58, . . . 68 to designate an upper bank/lower bank memory partition of 24 MB/8 MB, the higher order bits of the ZZZ decoding output ZZZ(15:12) are generated by the lower bank decoder 52, which is connected to the metal line segments in rows lb(12), lb(13), lb(14) and lb(15). The ZZZ decoding bits ZZZ(11:8) are generated by the upper bank decoder 50, which is connected to the metal line segments in rows ub(8), ub(9), ub(10) and ub(11). The ZZZ(15:8) decoding bits are then passed through an inverter 69 to produce Z4 decoding signal bits Z4(15:8), which are subsequently transmitted to an X-decoder 70.

The X-decoder 70 may further be coupled to receive fixed bank address decoding bits such as bits Z4(16) and Z4(17), which are the decoding bits for memory blocks reserved for the lower memory bank, for example, the memory blocks SS0, SS1, SS2, . . . SS7 which belong to rows Z4(16) and Z4(17) as shown in FIG. 1. Referring back to FIG. 10, the X-decoder 70 is coupled to the memory array 72 and serves as the row decoder for the memory array 72. Within the memory array 72, the bit lines such as bit lines 74 and 76 can be flexibly partitioned into first and second bit line segments to partition the memory cells into lower and upper memory banks, respectively, in a manner similar to that which is shown in FIGS. 8 and 9 and described above.

Industrial Applicability

The method of forming flexibly partitioned metal line segments for a flash memory device according to the present invention is applicable to the fabrication of simultaneous operation flash memory devices with a flexible bank partition architecture. Memory devices with different upper and lower memory bank partitions can be produced by simply changing the metal option layer pattern while maintaining the same basic metal layer pattern. The basic metal layer has a plurality of gaps each designating one of a plurality of predetermined memory partition boundaries. After the metal option layer segments are placed on the basic metal layer, one of the gaps in the basic metal layer is left open to form the basic metal layer segments for the upper and lower memory banks. Flash memory devices with different upper and lower bank memory partitions can be produced by using the same integrated circuit design with different metal option layer patterns, which are relatively easy to generate especially by using computer-aided design techniques, thereby simplifying the fabrication of the flash memory device.

The invention has been described with respect to particular embodiments thereof, and numerous modifications can be made which are within the scope of the invention as set forth in the claims.

What is claimed is:

1. A method of forming metal line segments for a simultaneous operation flash memory device with a flexible bank partition architecture, the method comprising the steps of:
   (a) providing a plurality of basic metal layer segments separated by a plurality of gaps, each of the gaps having a predefined gap interval length; and
   (b) providing a metal option layer comprising a plurality of metal option layer segments on the basic metal layer segments, each of the metal option layer segments having a length at least as much as the gap interval length of a respective one of the gaps between the basic metal layer segments, the metal option layer segments overlapping some of the gaps between the basic metal layer segments but leaving one of the gaps open, to form a conductive path between the gaps except the one of the gaps which is left open, the basic metal layer segments and the metal option layer segments together forming first and second metal line segments for the simultaneous operation flash memory device with the flexible bank partition architecture.

2. The method of claim 1, wherein the step of providing the basic metal layer segments comprises the steps of:
   (i) depositing a basic metal layer on a semiconductor substrate; and
   (ii) etching the basic metal layer to form the basic metal layer segments.

3. The method of claim 2, wherein the step of providing the basic metal layer segments further comprises the steps of:
   (iii) patterning a first mask with a pattern of the basic metal layer segments separated by the gaps; and
   (iv) positioning the first mask on the basic metal layer prior to the step of etching the basic metal layer.

4. The method of claim 1, wherein the step of providing the metal option layer on the basic metal layer segments comprises the step of depositing the metal option layer segments on the respective gaps between the basic metal layer segments.

5. The method of claim 4, wherein the step of providing the metal option layer on the basic metal layer segments further comprises the step of providing a mask on the basic metal layer segments exposing the gaps which are to be overlapped with the metal option layer segments prior to the step of depositing the metal optional layer segments on the respective gaps.

6. The method of claim 1, wherein the number of metal option layer segments is one less than the number of gaps between the basic metal layer segments.

7. The method of claim 1, wherein the basic metal layer segments are each capable of supporting at least one sector of memory in the memory device.

8. The method of claim 1, wherein the one gap between the basic metal layer segments left open by the metal option layer segments subsequent to the step of providing the metal option layer on the basic metal layer segments is positioned to separate the basic metal layer into the first and second metal line segments capable of supporting upper and lower memory banks of the memory device, respectively.

9. The method of claim 1, wherein the length of each of the metal option layer segments is greater than the gap interval length of the respective gap.

10. The method of claim 1, wherein the step of providing the basic metal layer segments comprises the step of preparing a fixed mask pattern for a basic metal layer comprising the basic metal layer segments separated by the gaps, and wherein the step of providing the metal option layer comprises the step of preparing a mask pattern for the metal option layer comprising the metal option layer segments.

11. The method of claim 10, wherein the steps of preparing the mask patterns for the basic metal layer and for the metal option layer are performed on a computer.

12. The method of claim 10, further comprising the step of selecting a memory partition boundary from a plurality of predetermined memory boundaries designated by the gaps in the basic metal layer, prior to the step of preparing the mask pattern for the metal option layer.

13. The method of claim 12, further comprising the step of overlapping the mask pattern for the metal option layer with the mask pattern for the basic metal layer, such that the metal option layer segments cover some of the gaps in the basic metal layer except for the one of the gaps which is left open, the open gap designating the selected memory partition boundary.

14. The method of claim 13, wherein the step of overlapping the mask pattern for the metal option layer with the mask pattern for the basic metal layer is performed on a computer.

15. A method of forming metal line segments for a simultaneous operation flash memory device with a flexible bank partition architecture, the method comprising the steps of:

(a) depositing a basic metal layer on a semiconductor substrate;

(b) forming a plurality of basic metal layer segments by providing a plurality of gaps in the basic metal layer, each of the gaps having a predefined gap interval length;

(c) providing a metal option layer comprising a plurality of metal option layer segments on the basic metal layer, each of the metal option layer segments having a length at least as much as the gap interval length of a respective one of the gaps in the basic metal layer the metal option layer, the metal option layer segments overlapping some of the gaps in the basic metal layer but leaving one of the gaps in the basic metal layer open, to form a conductive path between the gaps in the basic metal layer except the one of the gaps which is left open, the basic metal layer segments and the metal option layer segments together forming first and second metal line segments for the simultaneous operation flash memory device with the flexible bank partition architecture.

16. The method of claim 15, wherein the step of forming the basic metal layer segments further comprises the steps of:

(i) patterning a first mask with a pattern of the basic metal layer segments separated by the gaps;

(ii) positioning the first mask on the basic metal layer; and (iii) etching the basic metal layer to form the gaps between the basic metal layer segments.

17. The method of claim 15, wherein the step of providing the metal option layer on the basic metal layer comprises the step of depositing the metal option layer segments on the respective gaps in the basic metal layer.

18. The method of claim 17, wherein the step of providing the metal option layer on the basic metal layer further comprises the step of providing a mask on the basic metal layer exposing the gaps which are to be overlapped with the metal option layer segments prior to the step of depositing the metal optional layer segments on the respective gaps.

19. The method of claim 15, wherein the number of metal option layer segments is one less than the number of gaps in the basic metal layer.

20. The method of claim 15, wherein the basic metal layer segments are each capable of supporting at least one sector of memory in the memory device.

21. The method of claim 15, wherein the one gap in the basic metal layer left open by the metal option layer segments subsequent to the step of providing the metal option layer on the basic metal layer is positioned to separate the basic metal layer into the first and second metal line segments capable of supporting upper and lower memory banks of the memory device, respectively.

22. The method of claim 15, wherein the length of each of the metal option layer segments is greater than the gap interval length of the respective gap in the basic metal layer.

23. A method of forming metal line segments for a simultaneous operation flash memory device with a flexible bank partition architecture, the method comprising the steps of:

(a) depositing a basic metal layer on a semiconductor substrate;

(b) forming a plurality of basic metal layer segments by providing a plurality of gaps in the basic metal layer, each of the gaps having a predefined gap interval length;

(c) providing a mask on the basic metal layer exposing the gaps which are to be overlapped with a plurality of metal option layer segments, the number of metal option layer segments being one less than the number of gaps in the basic metal layer, each of the metal option layer segments having a length at least as much as the gap interval length of a respective one of the gaps in the basic metal layer; and (d) depositing the metal option layer segments on the respective gaps in the basic metal layer, the metal option layer segments overlapping some of the gaps in the basic metal layer but leaving one of the gaps in the basic metal layer open, to form a conductive path between the gaps in the basic metal layer except the one of the gaps which is left open, the basic metal layer segments and the metal option layer segments together forming first and second metal line segments for the simultaneous operation flash memory device with the flexible bank partition architecture.

24. The method of claim 23, wherein the step of forming the basic metal layer segments further comprises the steps of:

(i) patterning a first mask with a pattern of the basic metal layer segments separated by the gaps;

(ii) positioning the first mask on the basic metal layer; and (iii) etching the basic metal layer to form the gaps between the basic metal layer segments.

25. The method of claim 23, wherein the basic metal layer segments are each capable of supporting at least one sector of memory in the memory device.

26. The method of claim 23, wherein the one gap in the basic metal layer left open by the metal option layer segments subsequent to the step of depositing the metal option layer segments on the respective gaps in the basic metal layer is positioned to separate the basic metal layer into the first and second metal line segments capable of supporting upper and lower memory banks of the memory device, respectively.

27. The method of claim 23, wherein the length of each of the metal option layer segments is greater than the gap interval length of the respective gap in the basic metal layer.

28. A method of forming metal line segments for a simultaneous operation flash memory device with a flexible bank partition architecture, the method comprising the steps of:

(a) providing a plurality of basic metal layer segments separated by a plurality of gaps, each of the gaps having a predefined gap interval length;

(b) providing a metal option layer comprising a plurality of metal option layer segments, the number of metal option layer segments being one less than the number of gaps between the basic metal layer segments, each of the metal option layer segments having a length at least as much as the gap interval length of a respective one of the gaps between the basic metal layer segments; and (c) positioning the metal option layer on the basic metal layer segments, the metal option layer segments overlapping some of the gaps between the basic metal layer segments but leaving one of the gaps open, to form a conductive path between the gaps except the one of the gaps which is left open, the basic metal layer segments and the metal option layer segments together forming first and second metal line segments for the simultaneous operation flash memory device with the flexible bank partition architecture.

29. The method of claim 28, wherein the step of providing the basic metal layer segments comprises the steps of:

(i) depositing a basic metal layer on a semiconductor substrate; and (ii) etching the basic metal layer to form the basic metal layer segments.

30. The method of claim 29, wherein the step of providing the basic metal layer segments further comprises the steps of:

(iii) patterning a first mask with a pattern of the basic metal layer segments separated by the gaps; and (iv) positioning the first mask on the basic metal layer prior to the step of etching the basic metal layer.

31. The method of claim 28, wherein the step of positioning the metal option layer on the basic metal layer segments comprises the step of depositing the metal option layer segments on the respective gaps between the basic metal layer segments.

32. The method of claim 28, wherein each of the basic metal layer segments is capable of supporting at least one sector of memory in the memory device.

33. The method of claim 28, wherein the one gap between the basic metal layer segments left open by the metal option layer segments subsequent to the step of positioning the metal option layer on the basic metal layer segments is positioned to separate the basic metal layer into the first and second metal line segments capable of supporting upper and lower memory banks of the memory device, respectively.

34. The method of claim 28, wherein the length of each of the metal option layer segments is greater than the gap interval length of the respective gap.

35. The method of claim 28, wherein the step of providing the basic metal layer segments comprises the step of preparing a fixed mask pattern for a basic metal layer comprising the basic metal segments separated by the gaps, and wherein the step of providing the metal option layer comprises the step of preparing a mask pattern for the metal option layer comprising the metal option layer segments.

36. The method of claim 35, wherein the steps of preparing the mask patterns for the basic metal layer and for the metal option layer are performed on a computer.

37. The method of claim 35, further comprising the step of selecting a memory partition boundary from a plurality of predetermined memory boundaries designated by the gaps in the basic metal layer, prior to the step of preparing the mask pattern for the metal option layer.

38. The method of claim 37, wherein the step of positioning the metal option layer on the basic metal layer segments comprises the step of overlapping the mask pattern for the metal option layer with the mask pattern for the basic metal layer, such that the metal option layer segments cover some of the gaps in the basic metal layer except for the one of the gaps which is left open, the open gap designating the selected memory partition boundary.

39. The method of claim 38, wherein the step of overlapping the mask pattern for the metal option layer with the mask pattern for the basic metal layer is performed on a computer.

* * * * *